US010964732B2

(12) United States Patent
Forrest et al.

(10) Patent No.: US 10,964,732 B2
(45) Date of Patent: Mar. 30, 2021

(54) FABRICATION OF THIN-FILM ELECTRONIC DEVICES WITH NON-DESTRUCTIVE WAFER REUSE

(71) Applicant: The Regents of the University of Michigan, Ann Arbor, MI (US)

(72) Inventors: Stephen R. Forrest, Ann Arbor, MI (US); Kyusang Lee, Ann Arbor, MI (US)

(73) Assignee: THE REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 0 days.

(21) Appl. No.: 16/703,562

(22) Filed: Dec. 4, 2019

(65) Prior Publication Data

US 2020/0266217 A1 Aug. 20, 2020

Related U.S. Application Data

(63) Continuation of application No. 15/101,287, filed as application No. PCT/US2014/068197 on Dec. 2, 2014, now Pat. No. 10,535,685.
(Continued)

(51) Int. Cl.
*H01L 27/12* (2006.01)
*H01L 21/02* (2006.01)
(Continued)

(52) U.S. Cl.
CPC ...... *H01L 27/127* (2013.01); *H01L 21/02002* (2013.01); *H01L 21/30604* (2013.01); *H01L 21/7806* (2013.01); *H01L 21/7813* (2013.01); *H01L 29/66742* (2013.01); *H01L 33/0093* (2020.05)

(58) Field of Classification Search
None
See application file for complete search history.

(56) References Cited

U.S. PATENT DOCUMENTS 5,438,241 A * 8/1995 Zavracky ............... A61B 3/113
315/169.3
6,720,640 B2 4/2004 Kuwabara et al.
(Continued)

OTHER PUBLICATIONS

International Search Report corresponding to International application No. PCT/US2014/068197, dated Mar. 31, 2015, 4 pages.
(Continued)

*Primary Examiner* — Robert K Carpenter
(74) *Attorney, Agent, or Firm* — Reising Ethington P.C.

(57) ABSTRACT

Thin-film electronic devices such as LED devices and field effect transistor devices are fabricated using a non-destructive epitaxial lift-off technique that allows indefinite reuse of a growth substrate. The method includes providing an epitaxial protective layer on the growth substrate and a sacrificial release layer between the protective layer and an active device layer. After the device layer is released from the growth substrate, the protective layer is selectively etched to provide a newly exposed surface suitable for epitaxial growth of another device layer. The entire thickness of the growth substrate is preserved, enabling continued reuse. Inorganic thin-film device layers can be transferred to a flexible secondary substrate, enabling formation of curved inorganic optoelectronic devices.

16 Claims, 14 Drawing Sheets

Related U.S. Application Data

(60) Provisional application No. 61/910,645, filed on Dec. 2, 2013.

(51) Int. Cl.

| | |
|---|---|
| *H01L 21/78* | (2006.01) |
| *H01L 33/00* | (2010.01) |
| *H01L 21/306* | (2006.01) |
| *H01L 29/66* | (2006.01) |

(56) References Cited

U.S. PATENT DOCUMENTS

| | | |
|---|---|---|
| 7,033,905 B2 | 4/2006 | Ghyselen et al. |
| 7,375,008 B2 | 5/2008 | Ghyselen et al. |
| 7,605,054 B2 | 10/2009 | Celler |
| 8,324,075 B2 | 12/2012 | Aulnette et al. |
| 2007/0087526 A1 | 4/2007 | Chhaimi et al. |
| 2011/0171813 A1 | 7/2011 | Rogers et al. |
| 2011/0186910 A1 | 8/2011 | Forrest et al. |
| 2011/0291247 A1 | 12/2011 | Letertre et al. |
| 2012/0097184 A1 | 4/2012 | Park et al. |
| 2012/0142142 A1 | 6/2012 | Chang et al. |
| 2013/0237001 A1 | 9/2013 | Forrest et al. |
| 2013/0313562 A1 | 11/2013 | Epler et al. |
| 2013/0316481 A1 | 11/2013 | Park et al. |
| 2014/0225503 A1 | 8/2014 | Mori et al. |

OTHER PUBLICATIONS

Written Opinion corresponding to International application No. PCT/US2014/068197, dated Mar. 31, 2015, 6 pages.

Ishikawa et al., "Macroscopic electronic behavior and atomic arrangements of GaAs surfaces immersed in HCl solution". Journal of Vacuum Science & Technology B: Microelectronics and Nanometer Structures, vol. 12(No. 4), pp. 2713-2719. doi:10.1116/1.587237, Jul./Aug. 1994.

Osakabe et al., "Study of GaAs(001) Surfaces Treated in Aqueous HCl Solutions". Japanese Journal of Applied Physics, vol. 36, Part 1, No. 12A, pp. 7119-7125, Dec. 1997.

Gaul et al., "True Blue Inorganic Optoelectronic Devices". Advanced Materials 12, pp. 935-946, Jul. 2000.

Xu et al., "Direct transfer patterning on three dimensionally deformed surfaces at micrometer resolutions and its application to hemispherical focal plane detector arrays". Organic Electronics 9, pp. 1122-1127, Aug. 2008.

Huang et al., "Laser lift-off technique and the re-utilization of GaN-based LED films grown on sapphire substrate". Optoelectronics Letters 4, pp. 354-357, Sep. 2008.

Ueda et al., "Separation of Thin GaN from Sapphire by Laser Lift-Off Technique". Japanese Journal of Applied Physics 50, 7 pages, Apr. 2011.

Kim et al., "Stretchable, transparent graphene interconnects for arrays of microscale inorganic light emitting diodes on rubber substrates", Nano letters 11, pp. 3881-3886, Jul. 2011.

Lee et al., "Reuse of GaAs substrates for epitaxial lift-off by employing protection layers", Journal of Applied Physics, 7 pages, Feb. 2012.

Shahrjerdi et al., "High-efficiency thin-film InGaP/InGaAs/Ge tandem solar cells enabled by controlled spalling technology", Applied Physics Letters 100, 4 pages, Feb. 2012.

Wagner et al., "Materials for stretchable electronics", MRS Bulletin 37, pp. 207-213, Mar. 2012.

Bedell et al., "Kerf-Less Removal of Si, Ge, and III-V Layers by Controlled Spalling to Enable Low-Cost PV Technologies", IEEE Journal of Photovoltaics 2, 141-147, Apr. 2012.

Song et al., "Digital cameras with designs inspired by the arthropod eye", Nature 497, pp. 95-99, May 2013.

Cheng et al., "Epitaxial Lift-off Process for Gallium Arsenide Substrate Reuse and Flexible Electronics", Nature Communications, pp. 1-7, dated Mar. 12, 2013.

Konagai et al., "High Efficiency GaAs Thin Film Solar Cells by Peeled Film Technology", Journal of Crystal Growth, vol. 45, pp. 277-280, dated in 1978.

Bauhuis et al., "Wafer Reuse for Repeated Growth of III-V Solar Cells", Progress in Photovoltaics: Research and Applications, vol. 18, pp. 155-159, dated Mar. 11, 2010.

Adams et al., "Demonstration of Multiple Substrate Reuses for Inverted Metamorphic Solar Cells", IEEE Journal of Photovoltaics, vol. 3, pp. 899-903, dated Apr. 2013.

Lee et al., "Multiple Growths of Epitaxial Lift-off Solar Cells From a Single InP Substrate", Applied Physics Letters, vol. 97, 101107, pp. 1-3, dated in 2010.

Yoon et al., "GaAs Photovoltaics and Optoelectronics Using Releasable Multilayer Epitaxial Assemblies", Nature, vol. 465, pp. 329-333, dated May 20, 2010.

\* cited by examiner

US 10,964,732 B2

FABRICATION OF THIN-FILM ELECTRONIC DEVICES WITH NON-DESTRUCTIVE WAFER REUSE

STATEMENT REGARDING FEDERALLY FUNDED RESEARCH

This invention was made with government support under DE-SC0001013 awarded by the Department of Energy, and W911NF-08-2-0004 awarded by the U.S. Army's Research Office. The government has certain rights in the invention.

BACKGROUND

Compound semiconductors are the basis for many of the highest-performance optical and electronic devices in use today. But widespread commercial application of compound semiconductors has been limited due at least in part to high substrate costs. Additionally, applications of inorganic light-emitting diodes (LEDs) for display technology are somewhat limited to large-area and low-resolution applications, such as outdoor LED screens, due to high production costs and difficulty of fabrication even though they may be brighter, more efficient, and longer-lasting that organic LEDs.

SUMMARY

In accordance with one or more embodiments, a method of making a thin-film electronic device comprising a device layer includes the steps of: (a) providing a growth substrate having a thickness and a surface suitable for epitaxial growth; (b) disposing an epitaxial protective layer over said surface of the growth substrate; (c) forming the device layer over the protective layer; (d) releasing the device layer from the growth substrate; (e) removing at least a portion of the epitaxial protective layer from the growth substrate to form a new surface suitable for epitaxial growth; and (0 reusing the growth substrate, including forming another device layer over the new surface. The entire thickness of the growth substrate is preserved in step (e).

In at least one embodiment, the method includes the step of transferring the device layer to a secondary substrate, and the step of transferring comprises releasing the device layer from the growth substrate.

In at least one embodiment, the method includes cold-weld bonding the growth substrate to the secondary substrate before releasing the device layer from the growth substrate.

In at least one embodiment, the thin-film electronic device includes the secondary substrate, and the method includes consecutively depositing a plurality of sublayers one over the other to form the device layer. The sublayers are consecutively deposited in reverse order from a desired order of the thin-film electronic device.

In at least one embodiment, the secondary substrate is a polymeric substrate.

In at least one embodiment, the method includes the step of stretching or shrinking the secondary substrate after releasing the device layer from the growth substrate.

In at least one embodiment, the thin-film electronic device comprises an inorganic optoelectronic device that includes at least a portion of the device layer.

In at least one embodiment, the thin-film electronic device includes a transistor that includes at least a portion of the device layer.

In at least one embodiment, the method includes disposing a plurality of sublayers to form the epitaxial protective layer, etching with a first etchant to remove one of the sublayers, and subsequently etching with a second etchant to remove another one of the sublayers.

In accordance with one or more embodiments, a method of making a thin-film electronic device includes the steps of: (a) forming a backplane circuit on a host substrate; and (b) disposing an optoelectronic device layer over the host substrate. The backplane circuit includes a thin-film transistor device layer, and at least a portion of the optoelectronic device layer is operatively connected with the thin-film transistor device layer. The method also includes the step of transferring one or both device layers from a growth substrate to the host substrate. An epitaxial layer is interposed between the growth substrate and the transferred layer before the step of transferring. The epitaxial layer remains with the growth substrate after the step of transferring and includes a plurality of epitaxial sublayers. Each sublayer has a different and selectively etchable material composition.

In at least one embodiment, the method includes the step of transferring the thin-film transistor device layer from the growth substrate to the host substrate. The host substrate is a polymeric substrate. The method further includes the step of stretching the host substrate to increase the spacing between individual transistors of the transistor device layer before disposing the optoelectronic device layer over the host substrate.

In at least one embodiment, the method includes the step of transferring the optoelectronic device layer from the growth substrate to the host substrate to form an array of pixels having a first color. The method further includes the step of transferring another optoelectronic device layer to the host substrate to form another array of pixels having a second color different from the first color.

In at least one embodiment, the method includes transferring another optoelectronic device layer from another growth substrate to the host substrate by non-destructive epitaxial lift-off.

In accordance with one or more embodiments, an apparatus for use in making a thin-film electronic device includes a growth substrate, a thin-film electronic device layer disposed over the substrate, an epitaxial protective layer interposed between the growth substrate and the device layer, and a release layer interposed between the protective layer and the device layer. The protective layer includes a sublayer that is etchable by a sublayer etchant that does not etch the growth substrate, and the release layer is etchable by a release etchant that does not etch the protective layer.

In at least one embodiment, a thin-film electronic device is formed from the apparatus. The device layer comprises an optoelectronic device layer or a thin-film transistor device layer.

In at least one embodiment, the thin-film electronic device includes a flexible polymeric host substrate bonded to the device layer.

Within the scope of this disclosure it is intended that the various aspects, embodiments, examples, features and alternatives set out in the preceding paragraphs, in the claims and/or in the following description and drawings may be taken independently or in any combination thereof. For example, features disclosed in connection with one embodiment are applicable to all embodiments, except where there is incompatibility of features.

DESCRIPTION OF THE DRAWINGS

One or more embodiments will hereinafter be described in conjunction with the appended drawings, wherein like designations denote like elements, and wherein.

DESCRIPTION OF THE ILLUSTRATED EMBODIMENTS

Figure 1:
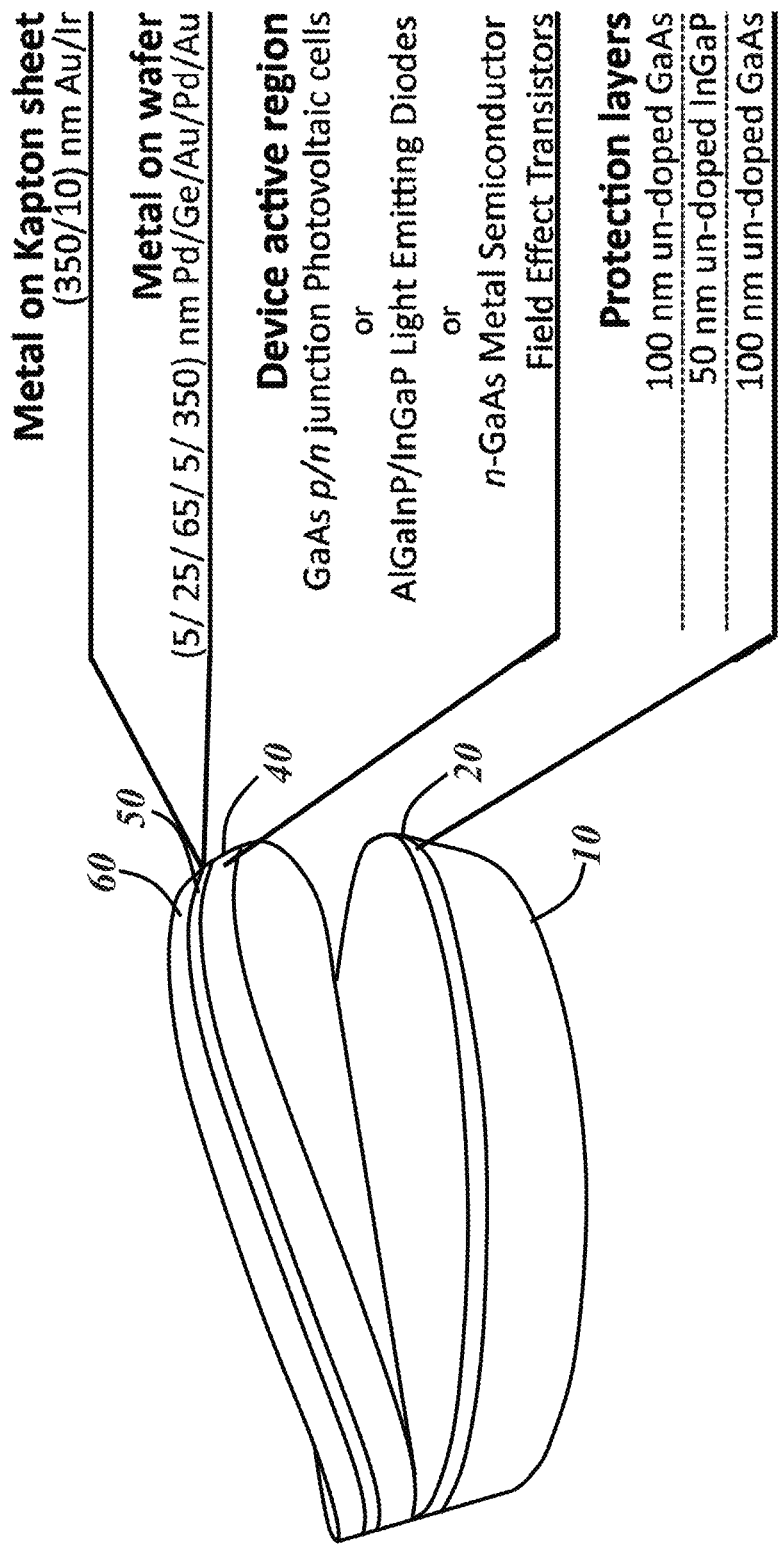
FIG. 1 is a schematic illustration of an example of a multi-layer structure for use in non-destructive epitaxial lift-off (ND-ELO)

Described below is a method of making low cost, thin-film electronic devices that allows for indefinite reuse of a growth substrate. The method employs a combination of epitaxial protection layers and cleaning techniques to return the growth substrate to its original epi-ready condition following epitaxial layer transfer to a secondary substrate.

The feasibility of this non-destructive epitaxial lift-off (ND-ELO) process is demonstrated below by way of an illustrative process in which inorganic LEDs are fabricated on the growth substrate and transferred, without loss of performance, onto flexible and lightweight plastic substrates. The same growth substrate is then reused for subsequent growth and transfer of additional LEDs without loss of performance. The process is further demonstrated by fabrication of multiple metal-semiconductor field effect transistors (MESFETs) on the same growth substrate with ND-ELO performed between the multiple fabrications. The method offers the potential for significant device cost reduction by eliminating consumption of the growth substrate and offers the use of inorganic thin-film devices in lightweight, semi-transparent, stretchable, conformal or flexible display panels, for example.

While described below in the context of LEDs, LED display panels, and MESFETs, the method is also useful for fabricating other types of thin-film electronic devices. Examples of other types of optoelectronic devices include photovoltaic (PV) cells and devices. Multi-color inorganic LED arrays (e.g., RGB arrays) can also be fabricated. In one embodiment, blue or ultraviolet inorganic LEDs are combined with inorganic phosphors for down-conversion. Other types of thin-film transistors include junction field effect transistors (JFETs), heterostructure field effect transistors (HFETs), modulation-doped field effect transistors (MODFETs), and heterojunction bipolar transistors (HBTs). Thin-film compound semiconductor logic gates, single-transistor passive or three-transistor active matrices for display, and image sensor backplane circuits can be fabricated with growth substrate reuse. Transferred thin film transistor arrays can be employed as a backplane circuit for displays and image sensors. It is also possible to scale-up the size of a fabricated LED display, or to increase the spacing between individual transistors of a backplane circuit by employing a stretchable secondary or host substrate.

While it may be possible to reuse a growth substrate or wafer by polishing the surface of the growth substrate after removal of the epitaxial device layers to return the substrate to an epi-ready condition, processes such as chemo-mechanical polishing reduce the substrate thickness and ultimately cause additional damage, limiting reuse of the growth substrate to very few cycles. As described below, one or more protective layers can be disposed between the growth substrate and the active device layers to allow the growth surface of the substrate to be restored to a suitable epitaxial growth condition while maintaining the full thickness of the substrate with no observable degradation in surface quality or fabricated device performance.

The protective layers may be selected such that they can be selectively etched and removed. The protective layers may include alternating lattice-matched materials, such as arsenide-based and phosphide-based material layers, for example. This combination of lattice-matched protection layers and non-destructive surface cleaning is adaptable to all thin-film electronic devices (e.g., III-V based LEDs) without material composition limitations and eliminates any need for damage-inducing wafer polishing. The ND-ELO methods described herein can also eliminate interfaces between materials with different group-V species, which removes the need for temperature changes during growth, decreasing both the growth time and the amount of material used.

In one embodiment, the ND-ELO process is used to fabricate a thin-film optoelectronic device, such as an inorganic LED device or a device including a thin-film transistor. An example of an inorganic LED device is an LED display panel with an array of red/green/blue (RGB) LEDs. Since the LED active region is very thin, LEDs can be transferred to a flexible plastic substrate and used as light weight and flexible displays. Using a vacuum mold, the flexible device can be formed to a conformal shape to form a curved display. Such an LED display panel may also include thin-film transistors. For example, an LED display may include a backplane circuit comprising an array of thin-film transistors in registration with pixels of an LED optoelectronic device layer as part of an LED or pixel control structure. Thus, an LED display may include a plurality of layers transferred from one or more reusable growth substrates with ND-ELO and new device layer growth employed between transfer steps.

Figure 2:
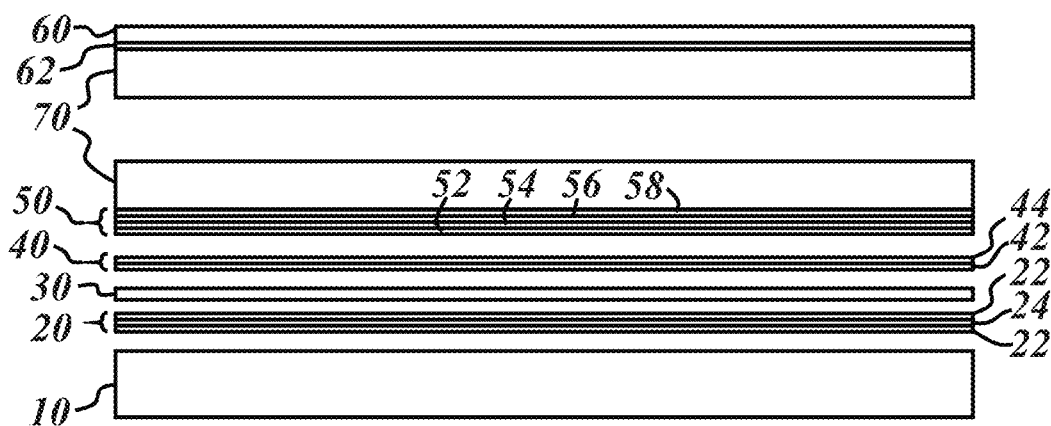
FIG. 2 is a schematic side-view of the multi-layer structure of FIG. 1, separately illustrating some of the layers.

FIG. 1 generally illustrates a thin-film electronic device being fabricated via an illustrative ND-ELO process that facilitates substrate wafer reuse. The process is shown during a stage at which the device active layers or region 40 (e.g., the LED or LEDs) is being transferred to a flexible secondary substrate 60 (e.g., Kapton) from the growth substrate or wafer 10. FIG. 2 shows the layered structure in more detail prior to device transfer. It is noted that the layer thicknesses are not necessarily to scale, as some layer thicknesses are exaggerated for purposes of illustration.

Referring to both of FIGS. 1 and 2, the illustrated epitaxial structure is fabricated to include a protective layer 20, a sacrificial release layer 30, and an active device layer 40 disposed over a growth substrate or wafer 10. Each of the layers 20, 30, 40 is designated by function and may include multiple individual sublayers, as shown in FIG. 2. The layer thicknesses and compositions given in FIG. 1 are non-limiting examples, and the layers are shown generically in FIG. 2. In this particular example, the protective layer 20 includes alternating layers 22, 24 of GaAs (100 nm) and InGaP (50 nm), disposed over a GaAs growth substrate 10. The sublayers 22, 24 may be grown by gas source molecular beam epitaxy (GSMBE) on a 2-inch diameter (100) GaAs wafer to form the protective layer 20, for example. The process is compatible with growth by other common techniques. The sacrificial release layer 30, in this case AlAs, is then grown or otherwise disposed over the protective layer 20. Next, the active device layer 40 is grown or otherwise disposed over the release layer 30. The individual layers 42, 44 of the device layer 40 are grown in inverted order such that, after transfer to the secondary substrate 60, the device layer is in the desired orientation for use, thus eliminating the need for a second transfer step.

A contact layer 50, including one or more individual conductive sublayers, is then deposited over the device layer 40. In this example, consecutive sublayers 52, 54, 56, 58 of palladium (5 nm), germanium (25 nm), gold (65 nm), and palladium (5 nm) are deposited over the substrate 10, protective layer 20, release layer 30, and device layer 40 (e.g. via e-beam evaporation) to form an ohmic contact with the device layer. In one example, the contact layer 50 forms an ohmic contact with a $5 \times 10^{18}$ cm$^{-3}$ Si-doped n-type GaAs layer 44 of the device layer 40.

The epitaxial structure grown on the substrate 10 can be attached to the secondary or host substrate 60 following layer growth using a thermally-assisted cold-weld bond through the application of pressure on the bonding surfaces. In one example the secondary substrate 60 is a polymeric, elastomeric, or other flexible substrate. A polyimide film (e.g., Kapton) is one example of a suitable flexible polymeric secondary substrate. To form the cold-weld bond, the opposing surfaces that are to be bonded are each coated with a layer 70 of a similar noble metal, such as gold (Au). An adhesion layer 62 may be interposed between the secondary substrate 60 and the respective metal layer 70. In one embodiment, the adhesion layer 62 is a 10 nm layer of iridium (Ir) sputtered over the secondary substrate 60 prior to deposition of the metal layers 70. The adhesion layer 62 provides tensile strain to the secondary substrate 60 that significantly reduces the growth substrate 10 and secondary substrate 60 separation time (~5 hrs) more than 90% when compared with the ELO process without the adhesion layer (~2 days), and 35% when compared with a surface tension-assisted ELO process (~8 hrs).

In one embodiment, a 350 nm thick Au layer is simultaneously deposited on both of the opposing surfaces to provide cold-weld bonding surfaces; that is, over the growth substrate 10 and over the secondary substrate 60. Cold-weld bonding may be performed under vacuum (~$10^{-5}$ Torr) with an applied stress of 4 MPa at a stage temperature of 175° C. The thermal- and vacuum-assisted process allows for a reduction of about 92% in bonding pressure compared to room temperature cold-welding under ambient conditions. The gold bonding layer can perform the additional function as a back contact and mirror in some applications. In the case of LEDs, such a rear surface mirror can improve external quantum efficiency (EQE) by causing photons to be reflected back to the emitting surface instead of being absorbed by the secondary substrate when in use. Noble metals such as gold are not damaged by exposure to the release etchant (e.g., hydrofluoric acid) used in the ELO process and also prevent a layer of oxidation on the underlying layers that would otherwise increase the pressure required to form the cold-weld bond. Alternatively, other adhesives or bonding agents, such as thermal releasing tape, wax, or glue, may be used to bond the substrates 10, 60 together for device transfer.

Once the growth substrate 10 is bonded to the secondary substrate 60, the active device layer 40 is lifted-off from the growth substrate 10 by removal of the release layer 30. In one embodiment, the release layer is etchable by a release etchant such as hydrofluoric acid (HF). At least the release layer 30 may be immersed in HF for a sufficient period. Approximately 5 hours is sufficient in some cases where the release layer 30 is AlAs. Other etchants and etch times may be used with other sacrificial layers 30.

The separated layers, including the device layer 40, can then be fabricated into a thin-film electronic device, such as an LED, a photovoltaic (PV) device, or a thin-film transistor layer, for example. At this stage, the surface left behind on the growth substrate 10 after the release layer 30 is removed is relatively rough and not suitable for epitaxial growth. Oxides or other contaminants (e.g., $As_2O_3$) may also be present on the exposed surface. This relatively rough surface is shown in the atomic force microscope (AFM) image of FIG. 3(b), with the original growth substrate surface shown in FIG. 3(a). This morphological degradation can have a significant negative impact on device performance in subsequently grown layers, particularly with epitaxial layers, where crystalline order may be critical.

Figure 4:
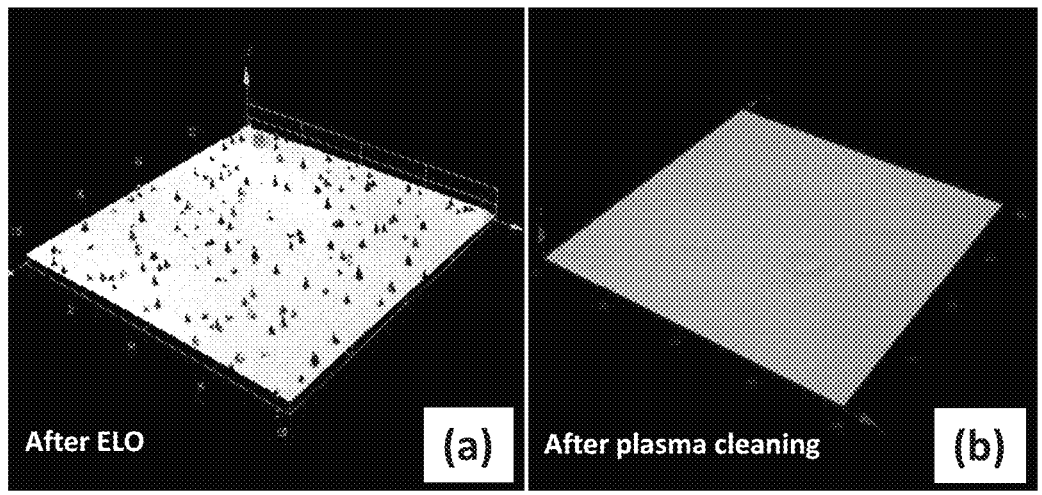
FIG. 4 includes three-dimensional laser microscopic images of: (a) the exposed surface after epitaxial lift-off of the device layer; and (b) after plasma cleaning.

To recover the original surface quality, a non-destructive cleaning technique may be employed. One embodiment of the non-destructive cleaning technique is a two-step process. The surface is first cleaned by removing oxides or other surface contaminants from the exposed surface. FIG. 4(a) is a 3D-laser microscopy image of the exposed surface over the growth substrate after release layer removal and before non-destructive cleaning. FIG. 4(b) is a 3D-laser microscopy image of the exposed surface of FIG. 4(a) after non-destructive cleaning. In one example, the non-destructive cleaning includes plasma cleaning. In one example, plasma cleaning includes cleaning via an inductively coupled plasma using 50 SCCM of $C_4F_8$, a chemical etching gas, to remove the oxides, mixed with 50 SCCM of Ar+ for 10 s under 10 mTorr of base pressure at a substrate RF bias power of 110 W and a transformer coupled plasma RF power of 500 W. As shown in FIG. 4(b), most or all of the surface contamination is removed during the cleaning process, leaving a less rough surface.

The exposed surface over the growth substrate is also shown before and after plasma cleaning in the respective AFM images of FIGS. 3(b) and 3(c). In this example, RMS surface roughness decreased by an order of magnitude after plasma cleaning, bringing the roughness of the exposed surface down to the original surface roughness or lower.

While the plasma cleaning eliminates the ELO process residuals, it can also physically and/or chemically damage the exposed surface of the protective layer 20. In the example of FIGS. 1 and 2, for instance, the final GaAs sublayer 22, and possibly the underlying InGaP layer 24, may be roughened by the plasma cleaning. Here, the multiple layers of protective layer 20 can come into play to fully prepare the exposed surface for further epitaxial deposition without damaging the original growth substrate. The roughened exposed GaAs protection layer 22 may be removed in a manner that does not damage the InGaP sublayer 24, such as by selective etching. In other words, the successive epitaxial sublayers of the protective layer 20 may be selected to have different material compositions, each of which is etchable by a different etchant and not etchable by the etchant of the other sublayer(s).

Figure 3:
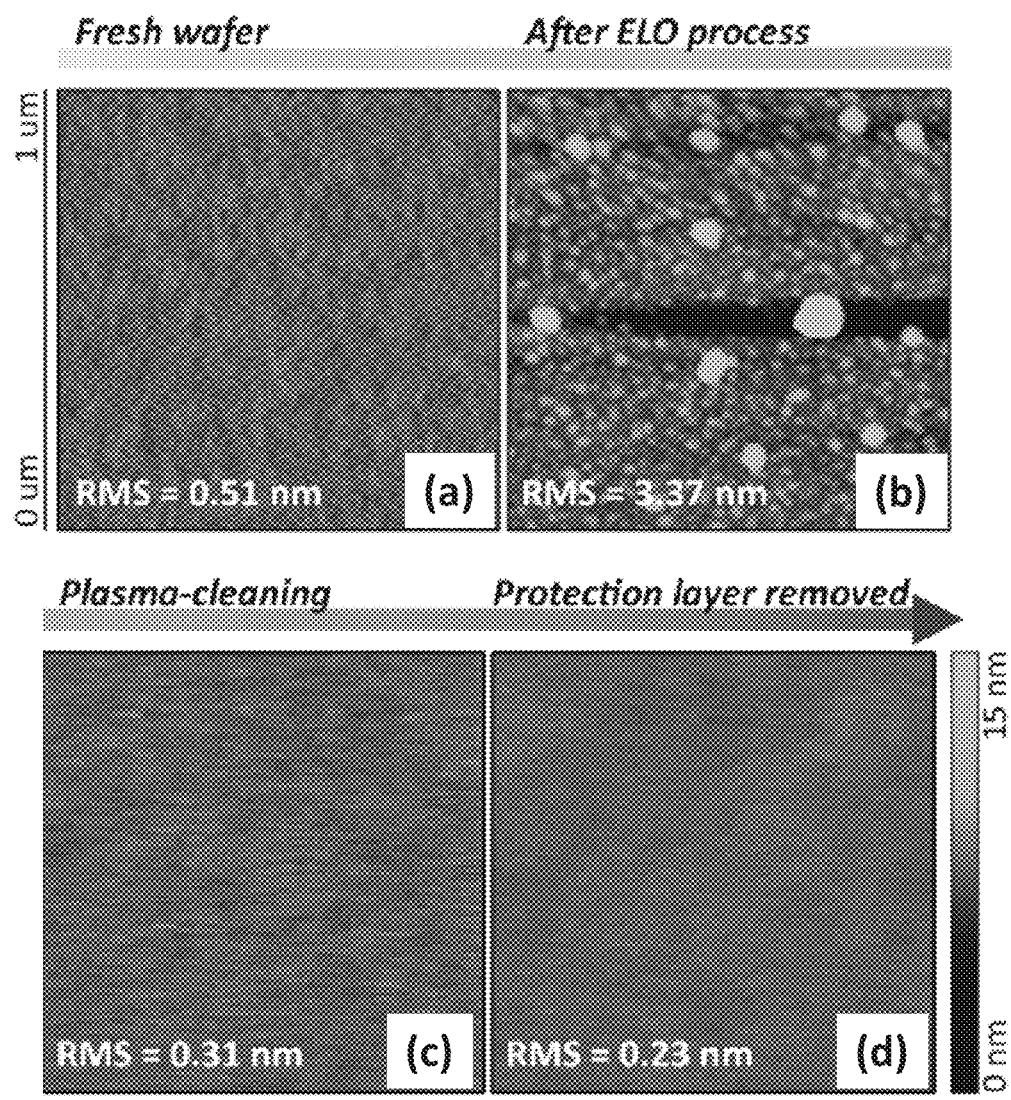
FIG. 3 includes atomic force microscopic images of an exposed surface over a growth substrate: (a) before first use; (b) after epitaxial lift-off of a device layer; (c) after plasma cleaning; and (d) after wet chemical cleaning to remove a portion of a protective layer.

In one example, the final sublayer 22 is GaAs and may be removed using a phosphoric acid-based etchant (e.g., $H_3PO_4:H_2O_2:H_2O$ (3:1:25)), which will not etch the underlying sublayer 24, which is InGaP in the example of FIG. 1. The $H_3PO_4$ etching thus stops at the InGaP layer. The exposed sublayer 24 of the protective layer 20 (e.g., InGaP) can then also be removed by selective etching by an etchant that etches InGaP, but not the underlying GaAs sublayer 22. Diluted hydrochloric acid ($HCl:H_2O$ (1:1)) provides complete etching selectivity with the remaining GaAs sublayer (or growth buffer layer) 22. Dilute HCl etch can also remove native oxides, allowing this last step of surface cleaning to result in a high quality surface for new epitaxial growth. The root mean square (RMS) surface roughness after each step is shown in FIG. 3, confirming recovery of the original surface quality after cleaning. In the example of FIG. 3, the exposed surface after ND-ELO has a lower roughness than the original, unused growth substrate.

Figure 5:
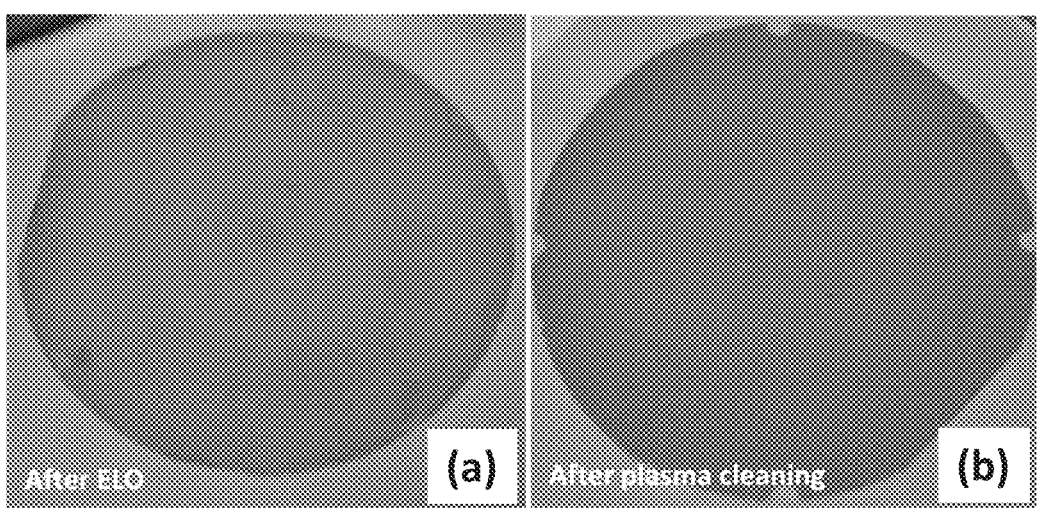
FIG. 5 includes photographic images of an exposed surface over a secondary substrate: (a) after epitaxial lift-off of the device layer; and (b) after plasma cleaning.

This cleaning procedure (i.e., plasma cleaning and/or selective etching) can be applied to the exposed surface of the lifted-off film (i.e., device layer 40) as well, which may be similarly contaminated following the removal of the release layer. FIG. 5(a) is a photographic image of the exposed surface over the secondary substrate after release layer removal and before plasma cleaning. FIG. 5(b) is an image of the same surface after plasma cleaning. In one embodiment, protective layers including different and selectively etchable sublayers (e.g., InGaP and GaAs) are grown on both opposite sides of the release layer 30 in reverse order to each other, starting with GaAs on the growth substrate.

Other protective layer compositions are also possible. In one embodiment, the protective layer 20 includes alternating epitaxial sublayers 22, 24 of InP and InGaAs grown over an InP growth substrate 10. These sublayer compositions are lattice matched with the InP substrate 10 and can be selectively etched in the same manner as InGaP/GaAs.

To demonstrate the effectiveness of growth substrate reuse using the above-described method, a growth substrate was used to fabricate an LED device, then cleaned according to the above-described ND-ELO technique before being used to fabricate a second LED on the same growth substrate in a GSMBE chamber. The same procedure was repeated multiple times with AlGaInP/GaInP double heterostructure red LEDs fabricated after each growth/ELO/cleaning cycle to ensure that no degradation of the original growth substrate was carried into the next cycle. In addition, multiple cycles of n-GaAs MESFET fabrication on the same growth substrate has been conducted with the ND-ELO process after each growth cycle and before each new growth cycle. Detailed experimental procedures and results are described below in the description of working examples.

This method can be applied to most III-V epitaxy lattice-matched or strained epitaxial layers with GaAs. AlGaAs- or AlGaInP-based red LEDs and AlGaInP- or AlGaP-based green LEDs can be fabricated using the same method as a red/green pixel for display technology. In addition, infrared (GaAs or AlGaAs), orange (AlGaInP), and yellow (AlGaInP) LEDs can be made with the same method. To fabricate three color, thin-film LED pixels for display panels, blue LEDs based on InGaN, GaN or ZnSe can be fabricated using laser lift-off (LLO) or spalling from a Si, SiC or sapphire substrate.

Alternatively, three color LED pixels can be fabricated using three blue or ultraviolet (UV) LEDs and phosphors for down conversion. Thin-film blue or UV LEDs can be fabricated based on InGaN, AlN, AlGaN or AlGaInN via LLO or spalling. Three color LEDs can include either: blue LEDs, blue LEDs with red phosphor, and blue LEDs with green phosphor; or UV LEDs with blue phosphor, UV LEDs with red phosphor, and UV LEDs with green phosphor. Other combinations are possible. Each pixel may be integrated with a backplane circuit to form and operate an LED display device. Illustrative embodiments of method for forming an aligned three-color pixel with a transistor backplane circuit are described below.

Figure 6:
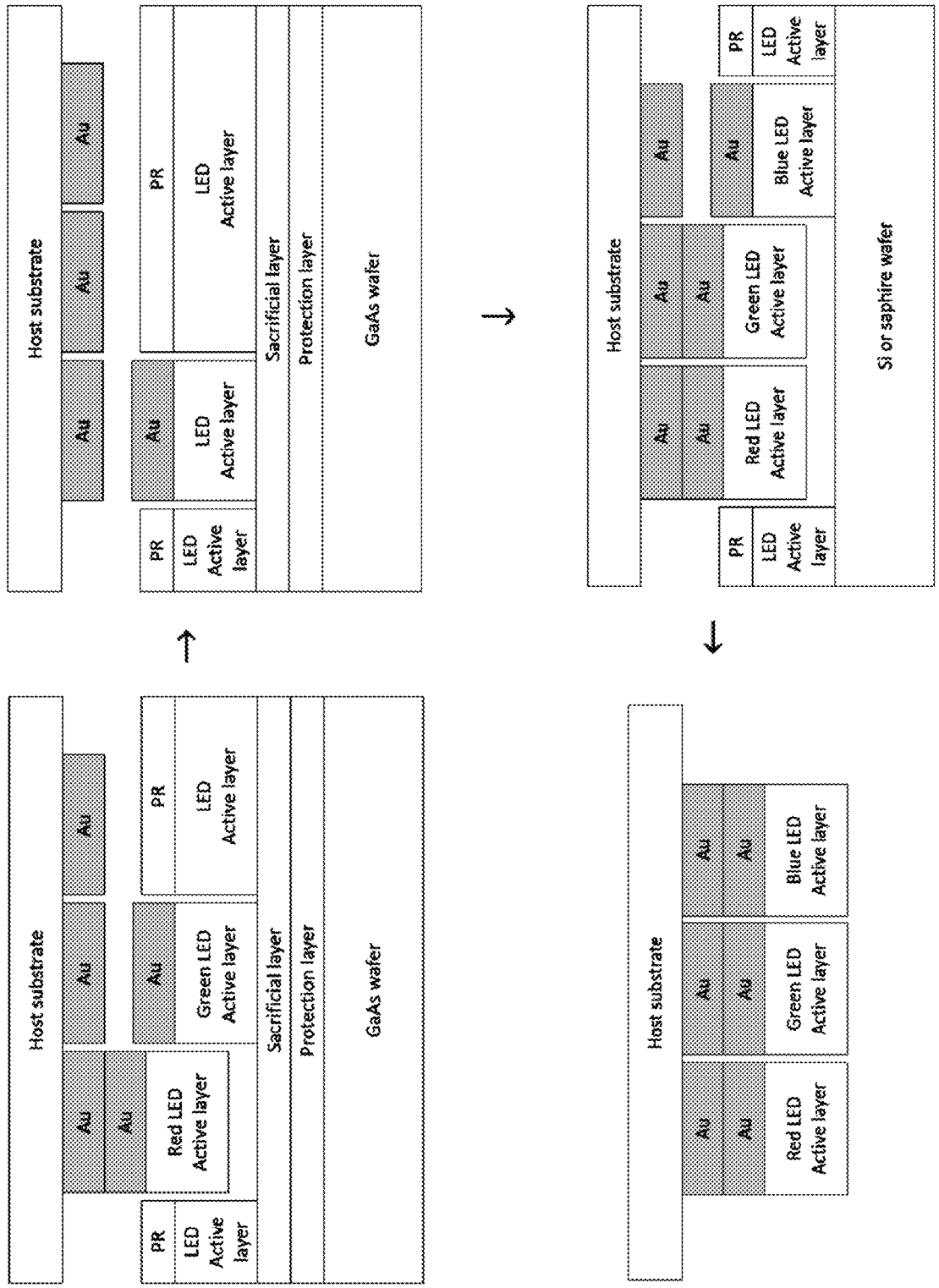
FIG. 6 is a process flow diagram of an example of LED pixel transfer from three different growth substrates to a common host substrate.
Figure 7:
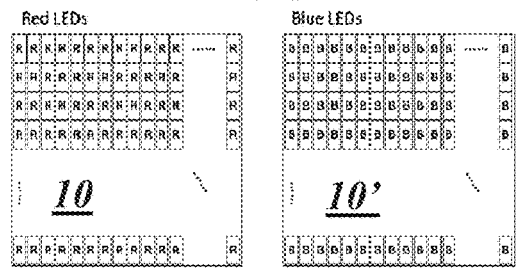
FIG. 7 is a process flow diagram of an example of LED pixel transfer in three batches from three different growth substrates to three host substrates.
Figure 7:
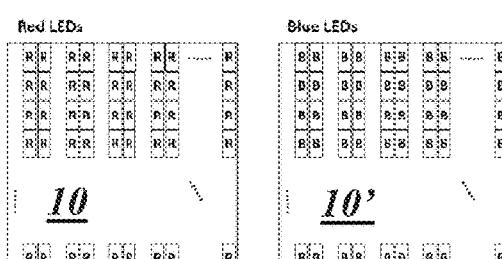
Figure 7:
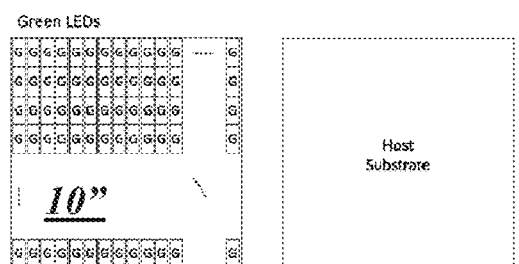
Figure 7:
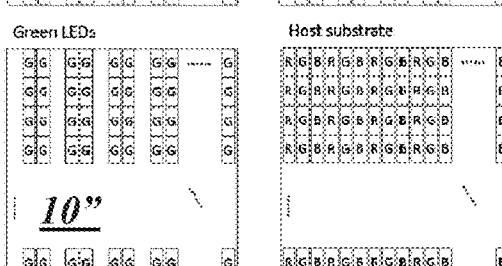
Figure 7:
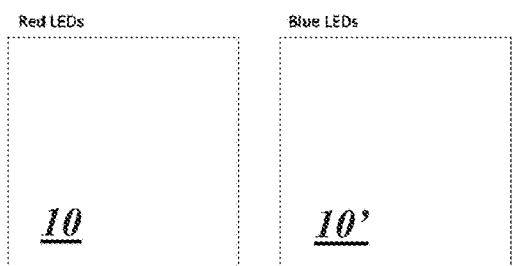
Figure 7:
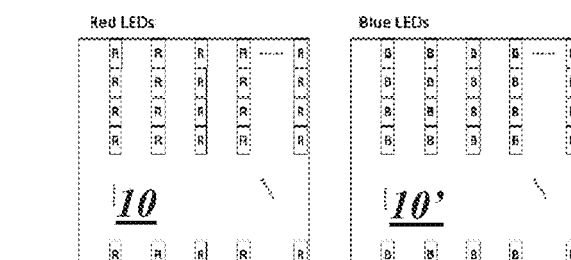
Figure 7:
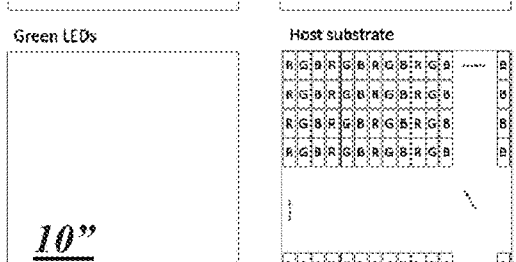
Figure 7:
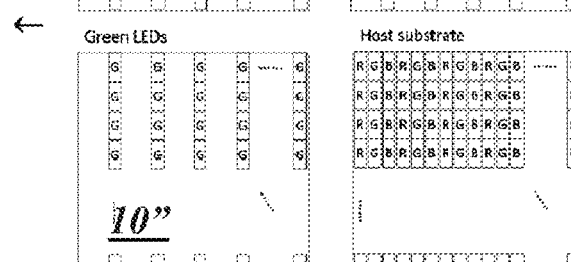

In one embodiment, LEDs of different pixel colors are fabricated separately (i.e., a first color of LEDs is fabricated separately from a second color of LEDs) for transfer to a secondary or host substrate through alignment with the backplane circuit. To transfer LEDs, a noble metal such as gold (Au) can be used both as a metal mask to define a device area and as a metal layer (e.g., metal layer 70 deposited over the growth substrate 10 in FIG. 2) for cold-weld bonding between the LEDs and transistor array. The LEDs of each growth substrate and the backplane circuit on the host substrate can be aligned for bonding using a transparent substrate, IR camera, or bonding aligner. After the cold-weld bonding, the LEDs can be separated from growth substrates via ND-ELO, LLO or spalling. In one embodiment, referring to FIGS. 6 and 7, each growth substrate can be used to make three batches of displays as large as the original growth substrate size. Alternatively, three color LEDs can be transferred to a transparent substrate (e.g., plastic or glass) before bonding with a backplane circuit. In the particular example of FIG. 7, three different colors of LED device layers are grown on three different growth substrates 10, 10', 10". Every third column of each color LED device layers is transferred from each of the three growth substrates to a common first host substrate 60 to form a first three-color LED device. Every second column of the remaining LED device layers of each of the three growth substrates is transferred from each of the three growth substrates to a common second host substrate 60' to form a second three-color LED device. And each remaining LED device layer of each of the three growth substrates is transferred from each of the three growth substrates to a common third host substrate 60″ to form a second three-color LED device In another embodiment, the active layers of each LED can be lifted-off from respective growth substrates and transferred to a temporary substrate. The transferred optoelectronic film layer can be patterned before being printed or transferred onto the backplane circuit either one by one or by batch.

Figure 8:
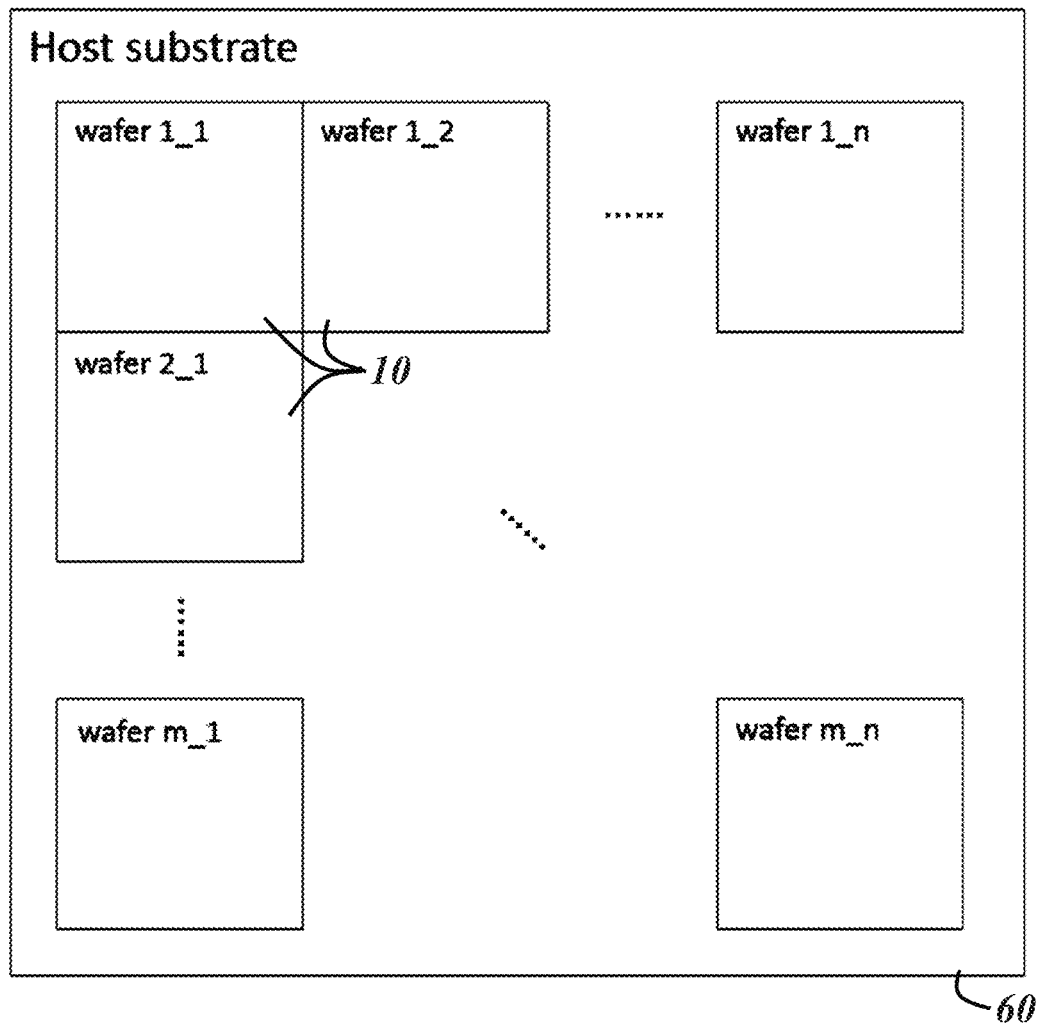
FIG. 8 is a schematic illustration of a process for use in fabricating large area LED arrays using multiple wafers transferring LEDs onto a single host substrate, the process being compatible with ND-ELO.

The method may also include scaling an LED or transistor array for mobile device-sized displays or for larger displays. Due to present limitations on III-V wafer size, a batch of LEDs cannot be larger than a 6-inch wafer. For mobile displays, a single wafer can be used to cover the display panel with LEDs or a backplane circuit with an array of transistors. For a large area display, multiple growth substrate wafers can be used to complete a single display panel that is larger than the individual growth substrates, as shown for example in FIG. 8.

Figure 9:
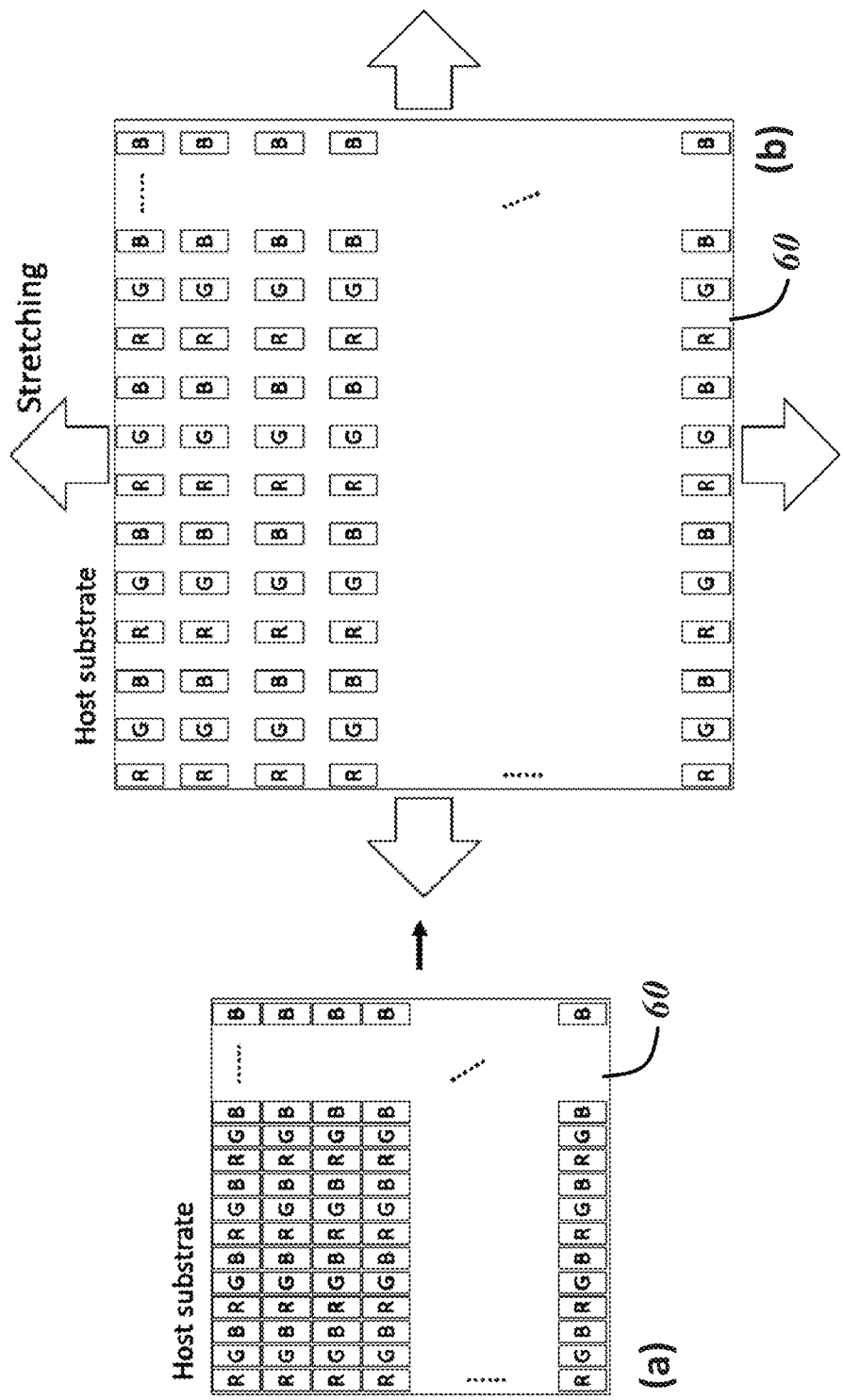
FIG. 9 is a schematic illustration of LEDs on a flexible substrate that can be stretched.

In another embodiment, the secondary substrate is an elastomeric or other flexible polymeric substrate. In this case, a variable density array of LEDs can be transferred to the secondary substrate 60 with a first LED density, as shown in FIG. 9(*a*). The substrate 60 and transferred LED array can then be stretched (or shrunk) as shown in FIG. 9(*b*) to a second LED density that is lower than the first LED density while achieving the desired device size.

Figure 10:
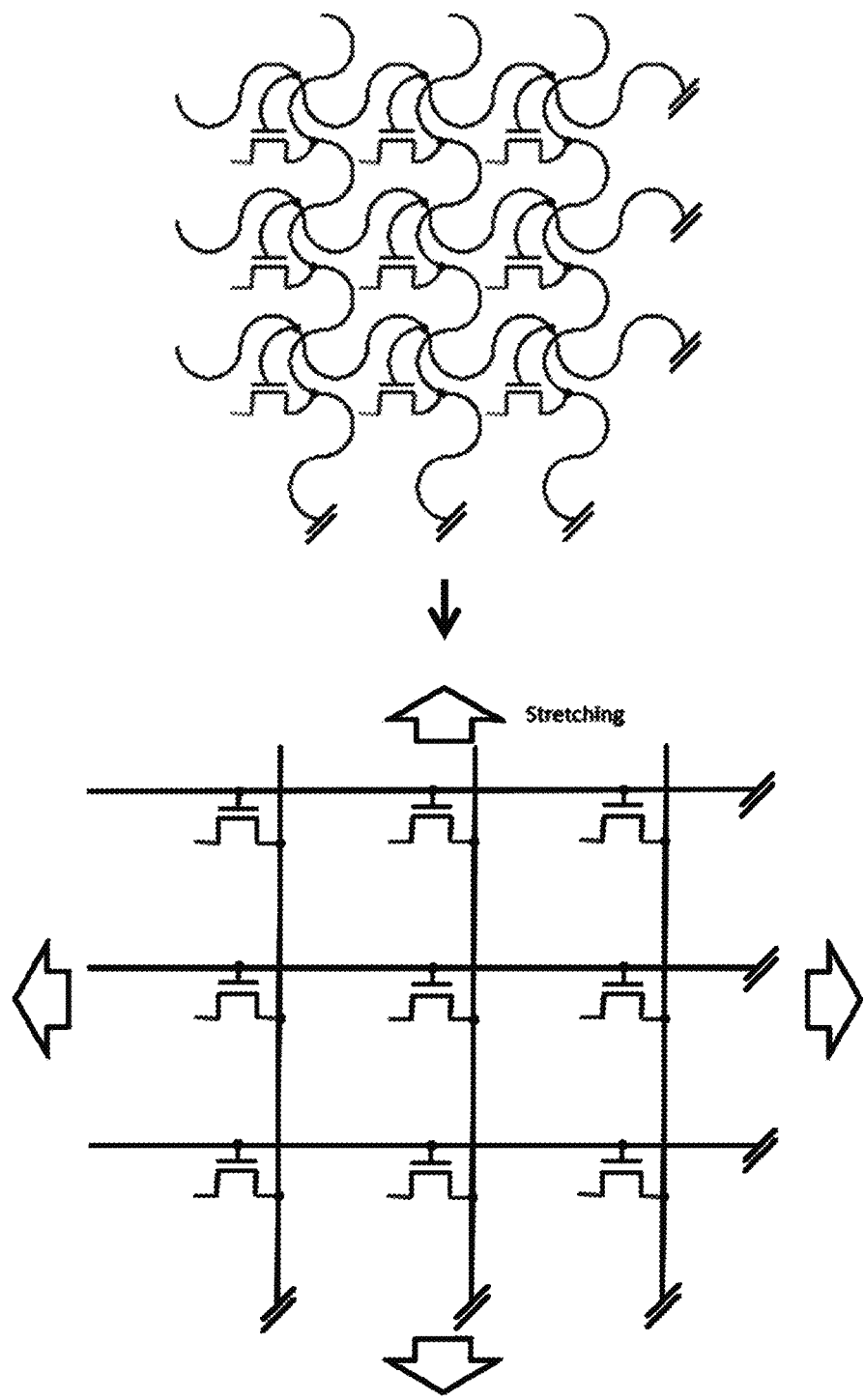
FIG. 10 is a schematic illustration of a transistor array on a flexible substrate that can be stretched.

When fabricating an active or passive array of transistors as a backplane circuit for displays or image sensors, there is typically a relatively large amount of empty space or area between adjacent transistors of the array occupied by LEDs and/or photodiodes of the display or image sensor. It is thus inefficient to directly transfer the backplane circuit onto the host substrate. In one embodiment, individual thin-film transistors are transferred from a growth substrate to their spaced apart locations on the host substrate by printing, which is more efficient, at least when considering the size of the growth substrate necessary to fabricate a larger backplane circuit. In another embodiment, the transistor array is selectively lifted off of the growth substrate so that multiple array batches can be achieved from a single substrate. In yet another example, a transistor array is grown on the growth substrate and transferred onto a stretchable (e.g., elastomeric) host substrate that is subsequently stretched. Similar to the variable density LED array of FIG. 9, FIG. 10 illustrates a variable density transistor array that can be expanded to its final dimensions by stretching the substrate, thereby providing the inter-transistor spacing necessary for LED or photodiode placement. This method can be combined with a multiple sample block transfer onto a single host substrate to form large circuits, such as a backplane circuit for the large display of FIG. 8.

Working Example—LED

Figure 11:
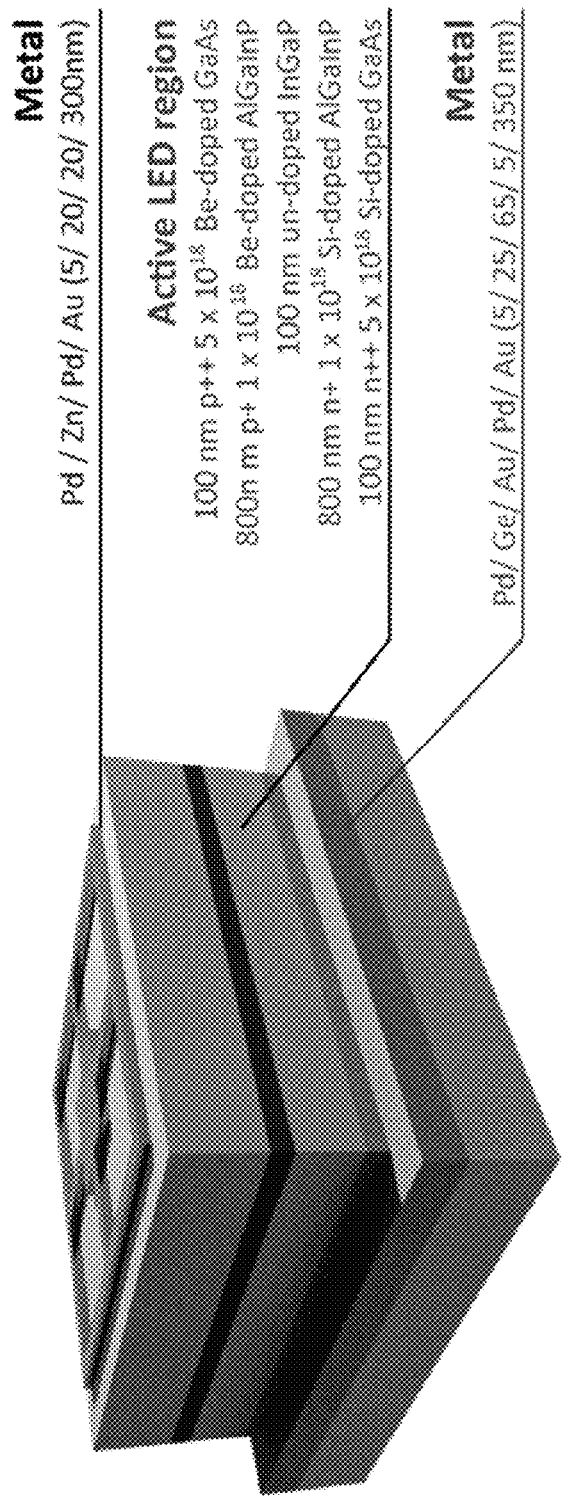
FIG. 11 is an example of a multi-layer LED structure formed with ND-ELO.

Functional flexible inorganic LED devices have been fabricated in accordance with the above-described methods using the following illustrative materials and methods. Epitaxial layers, including optoelectronic device layers, were grown by gas-source GSMBE on Zn-doped (100) p-GaAs growth substrates. For the protective layer, growth included GaAs (0.1 μm), $In_{0.49}Ga_{0.51}P$ (0.05 μm), and GaAs (0.1 μm) layers on the growth substrate. The sacrificial release layer was a 20 nm thick AlAs layer grown on the protective layer. Next, an inverted active LED layer was grown on the release layer with the following consecutively grown sublayers: a 0.1 μm thick, $5\times10^{18}$ $cm^{-3}$ Be-doped GaAs contact sublayer; a 0.8 μm thick, $2\times10^{18}$ $cm^{-3}$ Be-doped $Al_{0.20}In_{0.49}Ga_{0.31}P$ sublayer; a 0.1 μm thick, undoped $In_{0.49}Ga_{0.51}P$ sublayer; a 0.8 μm thick, $2\times10^{18}$ $cm^{-3}$ Si-doped $Al_{0.20}In_{0.49}Ga_{0.31}P$ sublayer; and a 0.1 μm thick, $5\times10^{18}$ $cm^{-3}$ Si-doped n-GaAs contact sublayer. This LED layer is shown in FIG. 11 as the active LED region (already released from the growth substrate). GaAs/AlAs layers were grown at 600° C. and $Al_{0.20}In_{0.49}Ga_{0.31}P/In_{0.49}Ga_{0.51}P$ layers were grown at 480° C.

Two freshly deposited 350 nm thick Au films on opposing surfaces (i.e., one over the device layer and growth substrate, and one over a flexible Kapton host substrate) were bonded together with the application of pressure. The GaAs wafer with epitaxial layers was bonded to the Kapton sheet using an EVG 520 wafer bonder under $\sim10^{-5}$ Torr vacuum, immediately following Au deposition by e-beam evaporation. The growth substrate diameter was 2 inches, and 4 MPa of pressure was applied to establish the bond between the two gold films with a 80 N/sec ramping rate. The thermally assisted cold-weld bonding process was carried out by ramping the temperature at 25° C./min to 175° C. and holding at the peak temperature for 3 minutes. The substrate temperature was subsequently reduced using active stage cooling. To apply a uniform force over the sample area, a reusable, soft graphite sheet was inserted between the sample and the press head.

After the GaAs growth substrate was bonded to the Kapton sheet, the thin device layered was released from the growth substrate via the above-described ND-ELO process. The entire sample was immersed in a 20% HF solution maintained at 60° C. The HF solution was agitated with a stir bar at 400 rpm. Due to the high etch selectivity between AlAs and the active compound semiconductor device layers, dilute HF removed the 20 nm thick AlAs sacrificial release layer between the wafer and active device region without attacking the adjacent layers. The total lift-off time for the 2 inch GaAs substrate was approximately 5 hours.

After the ND-ELO process, the thin-film active region and flexible plastic secondary substrate was fixed to a rigid substrate. The front finger grid was patterned by photolithography. Then, a metal contact layer, including sublayers Pd (5 nm)/Zn (20 nm)/Pd (15 nm)/Au (300 nm), was deposited by e-beam evaporation. The width of the front grid was 25 μm, and a 300 μm×300 μm contact pad was patterned at the center of the grid. The total coverage of the front contact was 22.7%. After the metal layer was lifted off, 680 μm×680 μm mesas were defined by photolithography using S-1827 (Microchem) and chemical etching using the same etchants that are used for solar cells. The thin-film LEDs were annealed for 1 hour at 200° C. for ohmic contact formation.

Figure 12:
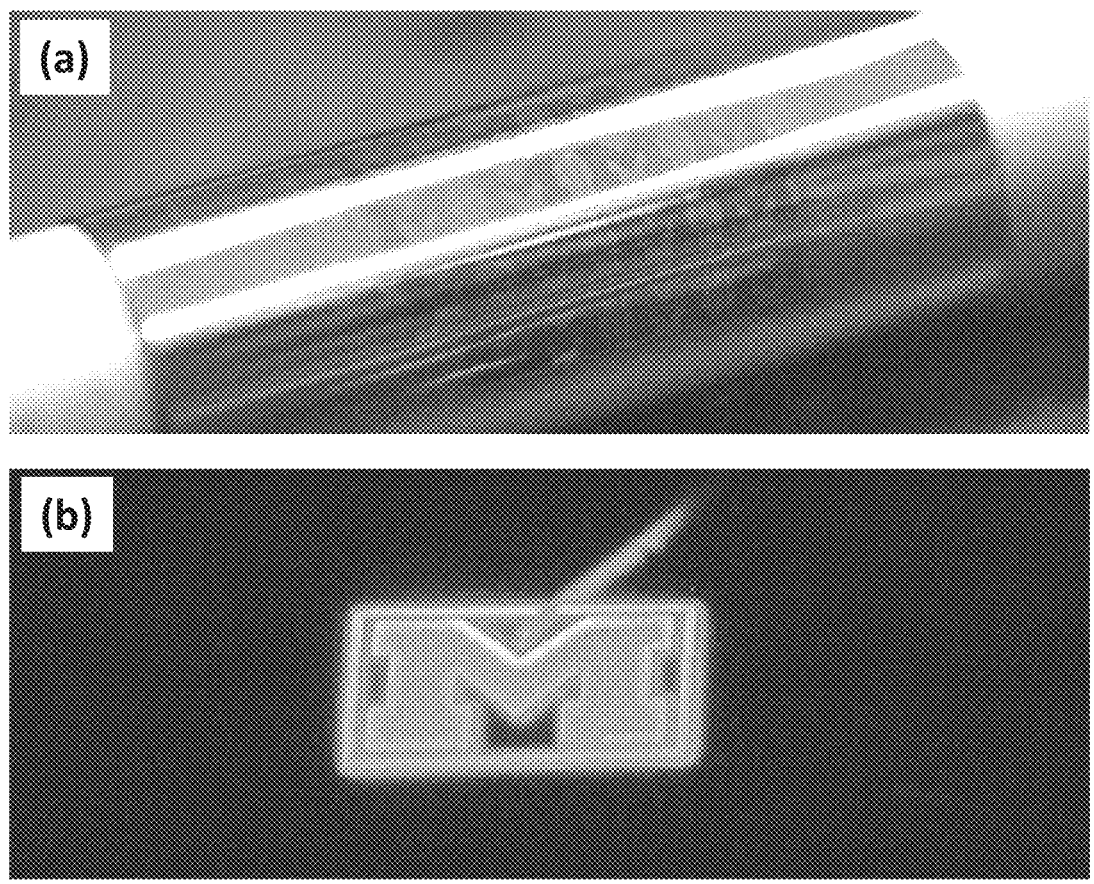
FIG. 12 includes photographic images of thin film LEDs wrapped around a 1.2 cm radius: (a) unpowered; and (b) powered.

Multiple cycles of AlGaInP/InGaP double heterojunction LEDs were grown and fabricated to test the generality of the method. FIG. 12 shows images of the fabricated thin film LEDs bent over a 1.2 cm radius, with (FIG. 12(*b*)) and without (FIG. 12(*a*) current injection without incurring damage or performance degradation, confirming device flexibility.

Figure 13:
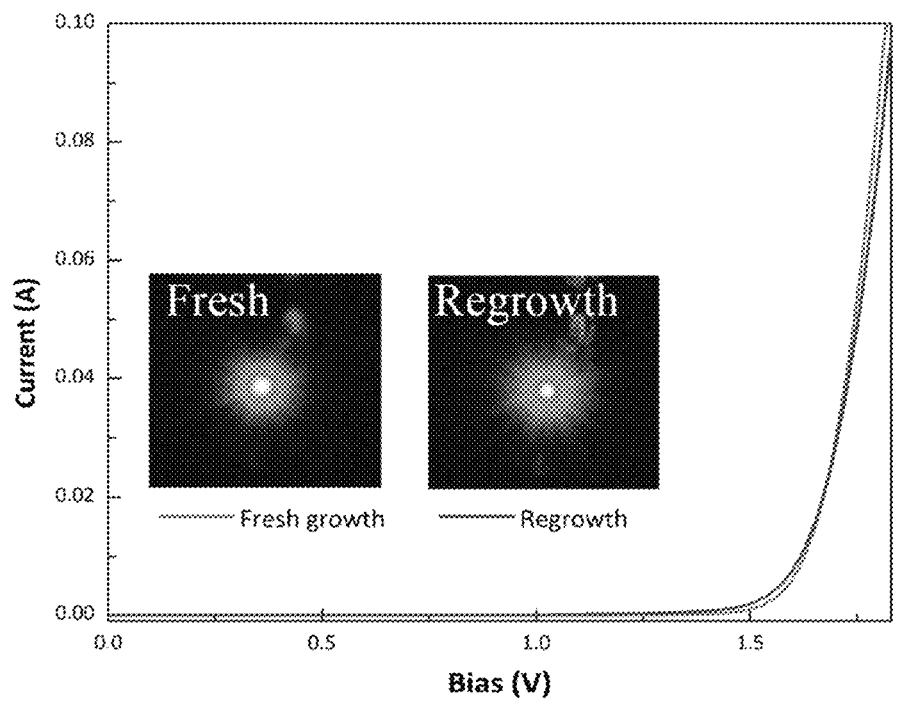
FIG. 13 is a chart illustrating current density as a function of voltage (J-V) for devices produced on an unused growth substrate and on a reused growth substrate after ND-ELO.
Figure 14:
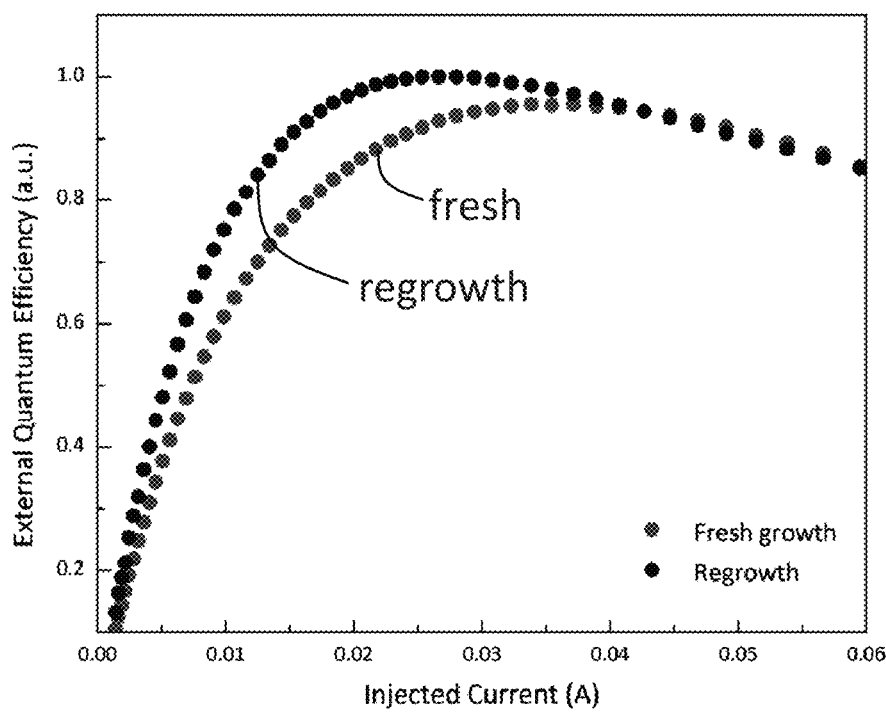
FIG. 14 is a chart illustrating external quantum efficiency (EFE) as a function of current for devices produced on an unused growth substrate and on a reused growth substrate after ND-ELO.
Figure 15:
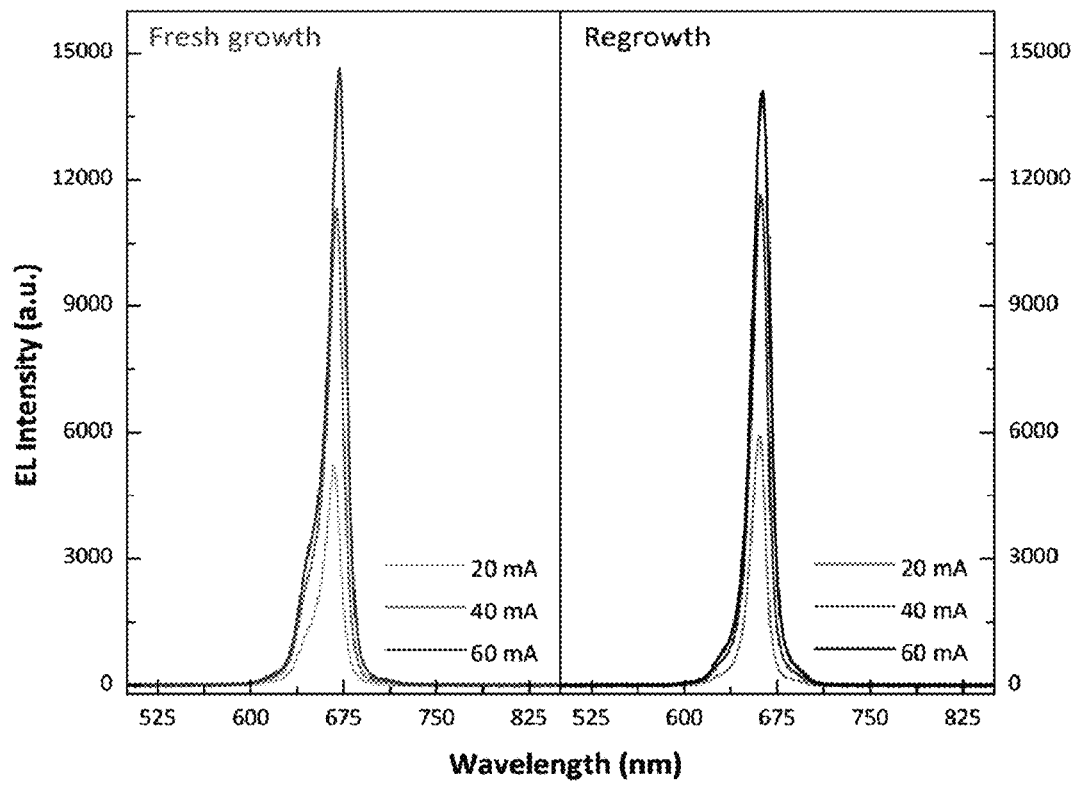
FIG. 15 includes electroluminescence spectra for LEDs after first and second CD-ELO removal from the same growth substrate.

The J-V and EQE characteristics of the first and second ND-ELO processed thin-film LEDs are compared in FIGS. 13 and 14, respectively. Turn-on voltage (1.66±0.01 V and 1.67±0.01 V, respectively) and peak EQE (4% variation) were extracted from the data for the first and second ELO cycles. Electroluminesence (EL) spectra for these same devices is provided in FIG. 15. The nearly identical performance of the first and second ELO-processed thin-film LEDs is confirmed by the measured full width half maxima of 16.5 nm and 16.6 nm, respectively, and peak EL intensities (3% variation) with an injection current of 60 mA.

Working Example—FET

Figure 16:
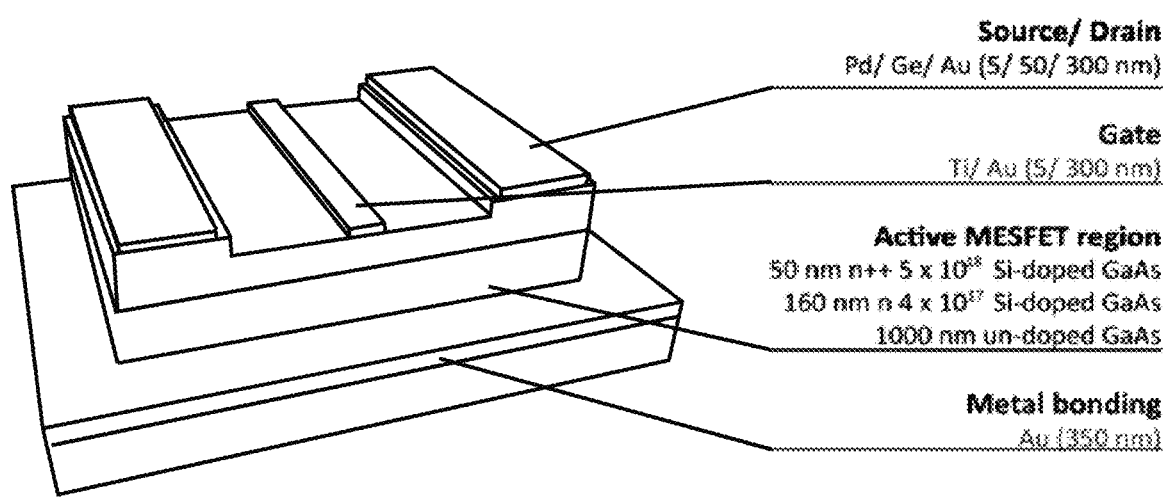
FIG. 16 is an example of a multi-layer MESFET device structure formed with ND-ELO.

Functional flexible inorganic thin-film transistor devices including field effect transistors (FETs) have been fabricated in accordance with the above-described methods using the following illustrative materials and methods. Epitaxial layers, including thin-film transistor device layers, were grown by gas-source GSMBE on Zn-doped (100) p-GaAs growth substrates. For the protective layer, growth included GaAs (0.1 μm), $In_{0.49}Ga_{0.51}P$ (0.05 μm), and GaAs (0.1 μm) layers on the growth substrate. The sacrificial release layer was a 20 nm thick AlAs layer grown on the protective layer. Next, an inverted active device layer was grown on the release layer with the following consecutively grown sublayers to form MESFETs: a 0.05 μm thick, $5 \times 10^{18}$ $cm^{-3}$ Si-doped GaAs contact sublayer; a 0.16 μm thick, $4 \times 10^{17}$ $cm^{-3}$ Si-doped GaAs channel sublayer; and a 1 μm thick, undoped GaAs sublayer. GaAs/AlAs layers were grown at 600° C. and $In_{0.49}Ga_{0.51}P$ layers were grown at 480° C. This MESFET device layer is shown in FIG. 16 as the active MESFET region (already released from the growth substrate).

Two freshly deposited 350 nm thick Au films on opposing surfaces (i.e., one over the device layer and growth substrate, and one over a flexible Kapton host substrate) were bonded together with the application of pressure. The GaAs wafer with epitaxial layers was bonded to the Kapton sheet using an EVG 520 wafer bonder under ~$10^{-5}$ Torr vacuum, immediately following Au deposition by e-beam evaporation. The growth substrate diameter was 2 inches, and 4 MPa of pressure was applied to establish the bond between the two gold films with a 80 N/sec ramping rate. The thermally assisted cold-weld bonding process was carried out by ramping the temperature at 25° C./min to 175° C. and holding at the peak temperature for 3 minutes. The substrate temperature was subsequently reduced using active stage cooling. To apply a uniform force over the sample area, a reusable, soft graphite sheet was inserted between the sample and the press head.

After the GaAs growth substrate was bonded to the Kapton sheet, the thin device layered was released from the growth substrate via the above-described ND-ELO process. The entire sample was immersed in a 20% HF solution maintained at 60° C. The HF solution was agitated with a stir bar at 400 rpm. Due to the high etch selectivity between AlAs and the active compound semiconductor device layers, dilute HF removed the 20 nm thick AlAs sacrificial release layer between the wafer and active device region without attacking the adjacent layers. The total lift-off time for the 2 inch GaAs substrate was approximately 5 hours.

After the ND-ELO process, 225 μm×250 μm mesas for ohmic contacts and channel layers were defined by photolithography for solar cells. Then, 210 μm deep mesas were etched using inductively coupled plasma etching using a Plasmalab System 100 (Oxford Instruments, Concord, Mass., USA). For plasma etching, the sample was attached to a Si-wafer carrier using thermal paste and Kapton tape. During etching, the stage was actively cooled to 5° C. using LN2. A source and drain contact was patterned by photolithography, and a Pd (5 nm)/Ge (50 nm)/Au (300 nm) metal contact was deposited by e-beam evaporation. The channel width and length were 250 μm and 25 μm. After the metal layer was lifted off, both the 50 nm highly n-doped GaAs contact layer and the 10 nm thick channel layer were selectively removed by inductively coupled plasma etching using the same procedure. The MESFETs were annealed for 1 hour at 240° C. for ohmic contact formation. Finally, a gate contact was patterned by photolithography, and a Ti (5 nm)/Au (300 nm) metal contact was deposited by e-beam evaporation. The patterned gate length was 11 μm, as measured by optical microscopy.

Figure 17:
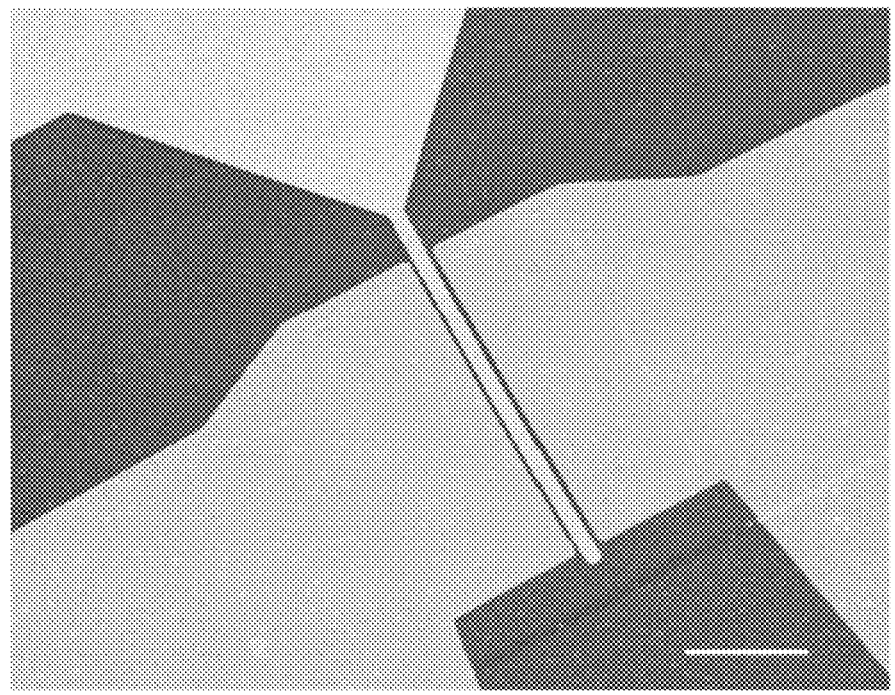
FIG. 17 is a scanning electron microscope (SEM) image of a fabricated MESFET.
Figure 18:
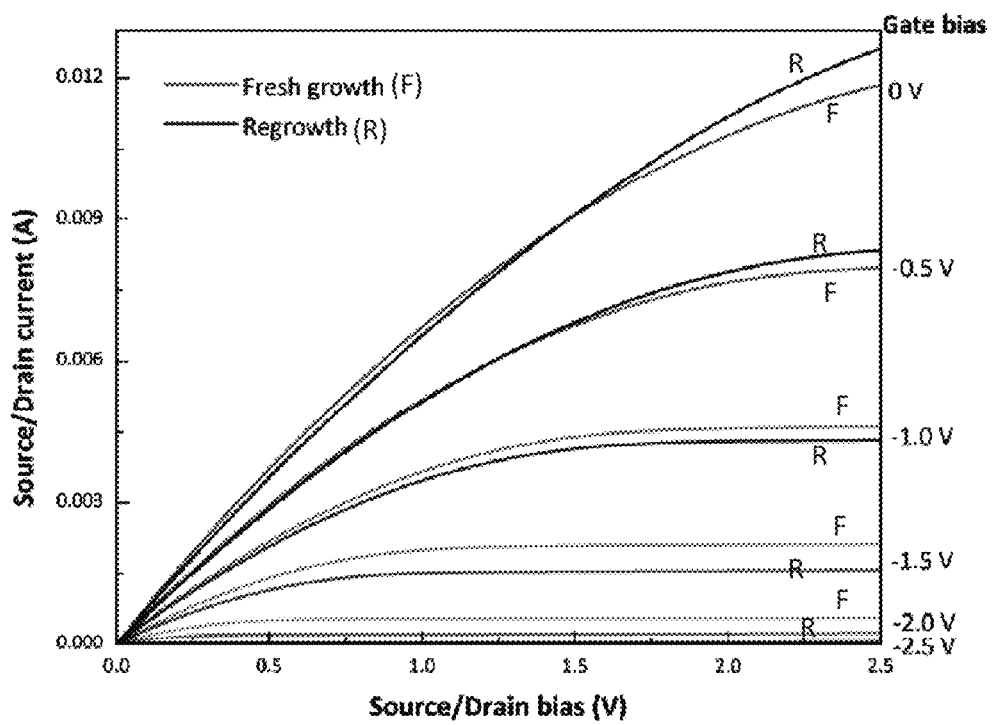
FIG. 18 is a chart that includes source drain current-gate voltage ($I_{DS}$-$V_G$) curves for MESFETs after first and second ND-ELO cycles.
Figure 19:
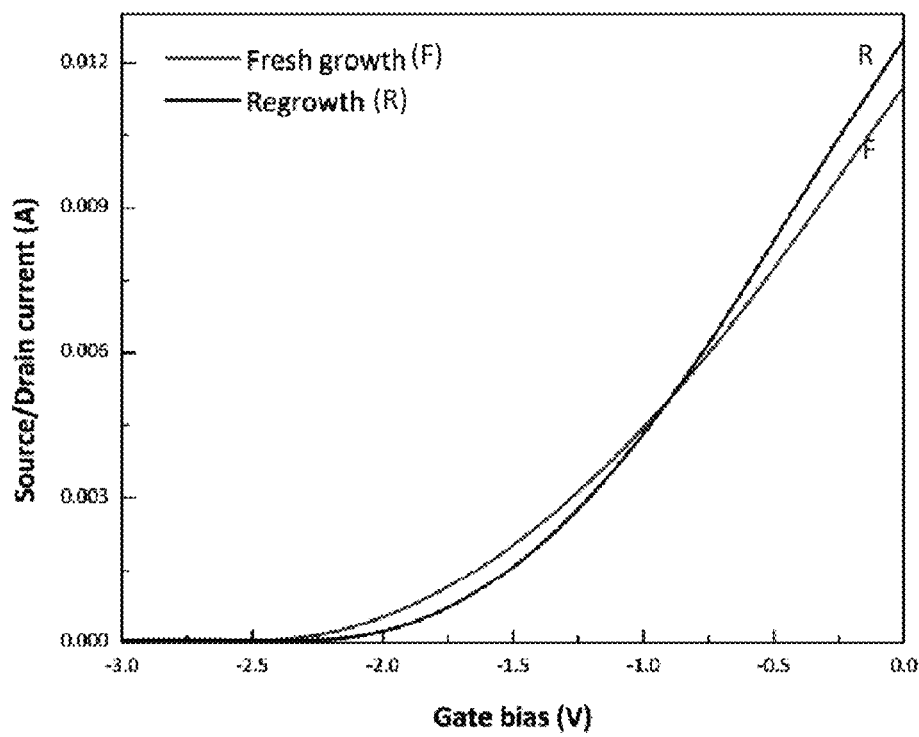
FIG. 19 is a chart that includes transfer curves for MESFETs after first and second ND-ELO cycles.

Two iterations of n-GaAs MESFETs were fabricated on a single growth substrate and transferred to plastic host substrates as shown in FIG. 16. The inverted MESFET device layer was grown with the active channel layer closer to the growth interface compared to a substrate-based device, therefore the device performance is relatively sensitive to the quality of the growth surface. FIG. 17 is a scanning electron microscope (SEM) image of a fabricated MESFET. FIGS. 18 and 19 are source drain current-gate voltage ($I_{DS}$-$V_G$) and transfer curves after the first (F) and second (R) ND-ELO cycles.

Figure 20:
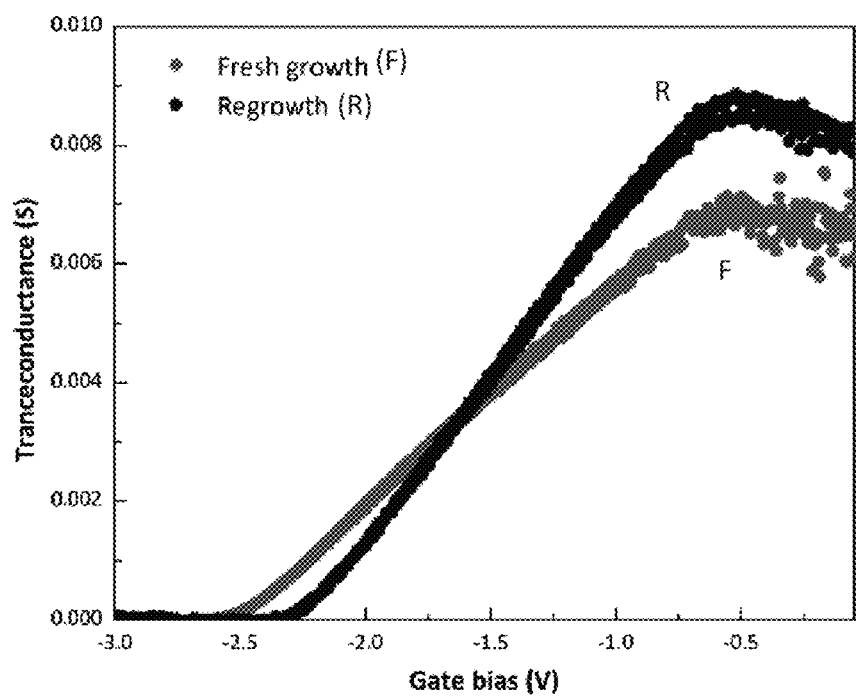
FIG. 20 is a chart illustrating the transconductance characteristics of thin film MESFETs, extracted from the transfer curves, after first and second ND-ELO cycles.

The transconductance characteristics of thin film MEFETs are extracted from the transfer curve and compared in FIG. 20. The similar transconductances of 7.5±0.5 mS for the first and second ELO processed MESFETs, which are more than twice that of MESFETs fabricated on glass substrates, indicates that the ND-ELO growth quality for these majority carrier electronic devices is no compromised by wafer recycling, epi-layer cleaning, and cold-weld bonding. Minor variations in device performance may arise from run-to-run variations in fabrication and growth.

It is to be understood that the foregoing is a description of one or more preferred exemplary embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. All such other embodiments, changes, and modifications are intended to come within the scope of the appended claims.

As used in this specification and claims, the terms "for example," "for instance," "such as," and "like," and the verbs "comprising," "having," "including," and their other verb forms, when used in conjunction with a listing of one or more components or other items, are each to be construed as open-ended, meaning that the listing is not to be considered as excluding other, additional components or items. Other terms are to be construed using their broadest reasonable meaning unless they are used in a context that requires a different interpretation.

The invention claimed is:

1. A method of making a thin-film electronic device, comprising the steps of:
   (a) transferring an optoelectronic device layer from a growth substrate to a polymeric substrate, wherein an epitaxial layer is interposed between the growth substrate and the optoelectronic device layer before the step of transferring, said epitaxial layer remaining with the growth substrate after the step of transferring and comprising a plurality of epitaxial sublayers, each sublayer having a different and selectively etchable material composition; and
   (b) stretching the polymeric substrate to increase the spacing between individual optoelectronic elements of the optoelectronic device layer; and
   (c) operably connecting the optoelectronic device layer to a backplane circuit, wherein the optoelectronic elements are inorganic LEDs, and the thin-film electronic device is a flexible LED display device.

2. The method of claim 1, wherein the optoelectronic elements are photodiodes.

3. The method of claim 1, further comprising the steps of:
removing the epitaxial layer from the growth substrate after step (a) such that an entire thickness of the growth substrate is preserved; and
forming another optoelectronic device layer on the growth substrate after the step of removing; and
transferring said another optoelectronic device layer to the polymeric substrate.

4. The method of claim 1, wherein the flexible LED display device includes the stretched polymeric substrate.

5. A method of making a thin-film electronic device comprising a device layer, the method comprising the steps of:
(a) providing the device layer on a substrate, the device layer comprising a plurality of individual electronic elements;
(b) transferring the device layer to a surface of a secondary substrate; and
(c) changing the size of said surface to thereby change a distance between the individual electronic elements of the device layer,
wherein the individual electronic elements are electrically interconnected before step (c) and remain electrically interconnected after step (c).

6. The method of claim 5, wherein step (c) comprises stretching the secondary substrate so that said distance is increased.

7. The method of claim 5, wherein the individual electronic elements are transistors of a thin-film transistor device layer.

8. The method of claim 5, wherein the individual electronic elements are inorganic LEDs of an optoelectronic device layer.

9. The method of claim 5, wherein the individual electronic elements are photodiodes of an optoelectronic device layer.

10. The method of claim 5, wherein the substrate of step (a) is a growth substrate with an epitaxial protective layer interposed between the growth substrate and the device layer, the epitaxial protective layer remaining with the growth substrate after step (b), the method further comprising selectively etching the protective layer to reclaim the growth substrate for use in subsequent device layer growth.

11. The method of claim 5, wherein the secondary substrate is a temporary substrate and step (c) comprises stretching the temporary substrate so that said distance is increased, the method further comprising the steps of:
transferring the device layer from the temporary substrate to a host substrate after step (c);
providing a second device layer on a second temporary substrate;
stretching the second temporary substrate so that a distance between individual electronic elements of the second device layer is increased; and, subsequently
transferring the second device layer to the host substrate.

12. The method of claim 11, wherein the device layer of steps (a) (c) is a thin-film transistor device layer, and the second device layer is an optoelectronic device layer.

13. The method of claim 12, wherein the individual electronic elements of the second device layer are LEDs, and the thin-film electronic device is an LED display.

14. A method of making a thin-film electronic device comprising a device layer, the method comprising the steps of:
(a) providing the device layer on a substrate, the device layer comprising a plurality of individual electronic elements;
(b) transferring the device layer to a surface of a secondary substrate; and
(c) changing the size of said surface to thereby change a distance between the individual electronic elements of the device layer,
wherein the individual electronic elements are inorganic LEDs of an optoelectronic device layer.

15. The method of claim 14, wherein the thin-film electronic device is a flexible LED display device.

16. The method of claim 14, wherein the thin-film electronic device includes the secondary substrate having the surface of which the size was changed in step (c).

* * * * *